(12) United States Patent
Peng (10) Patent No.: US 7,805,700 B2
(45) Date of Patent: Sep. 28, 2010

(54) PHYSICAL-RESIST MODEL USING FAST SWEEPING

(75) Inventor: Danping Peng, Fremont, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 363 days.

(21) Appl. No.: 11/773,923

(22) Filed: Jul. 5, 2007

(65) Prior Publication Data

US 2009/0013304 A1    Jan. 8, 2009

(51) Int. Cl.
 *G06F 17/50* (2006.01)
(52) U.S. Cl. .............................. 716/20; 716/19; 716/21; 430/5; 430/30
(58) Field of Classification Search ............. 716/19–21; 430/5, 30
See application file for complete search history.

(56) References Cited

OTHER PUBLICATIONS

"A Semi-Empirical Resist Dissolution Model for Sub-micron Lithographies", by Mumit Khan, Srinivas B. Bollepalli, and Frano Cerina, pp. 41-46, by Technical Proceedings of the 1998 International Conference on Modeling and Simulation of Microsystems, @1998.*

"An Overview of Level Set Methods for Etching, Deposition, and Lithography Development", pp. 1-30, by J.A. Sethian and D. Adalsteinsson, @ Jan. 8, 1996.*

* cited by examiner

*Primary Examiner*—Paul Dinh
*Assistant Examiner*—Nha T Nguyen
(74) *Attorney, Agent, or Firm*—Wilson Sonsini Goodrich & Rosati (57) ABSTRACT

A method for determining a surface in a material is described. During this method, arrival times of a wavefront at a first depth in the material are calculated using an Eikonal equation. Note that the first depth is proximate to an outer surface of the material. Next, arrival times of the wavefront at a second depth in the material are calculated using the Eikonal equation and the calculated arrival times at the first depth. Then, the surface in the material is determined based on the calculated arrival times at the first depth, the calculated arrival times at the second depth, and a given time interval. Note that arrival times at a given depth in the material, which includes the first depth or the second depth, are calculated by directly determining a steady-state solution of the Eikonal equation.

22 Claims, 6 Drawing Sheets

PHYSICAL-RESIST MODEL USING FAST SWEEPING

FIELD OF THE INVENTION

The present invention relates to techniques for modeling resist development in lithographic processes that use photomasks and semiconductor-manufacturing processes that use direct-write devices.

BACKGROUND

Lithography processing represents an essential technology for manufacturing Integrated Circuits (IC) and Micro Electro-Mechanical Systems (MEMS). In these processes, lithographic techniques are used to define patterns, geometries, features, shapes, etc. onto an integrated circuit die or semiconductor wafer or chips. For example, a photo-mask may be used to print a pattern in a layer on a semiconductor wafer that is subsequently developed to produce a feature. However, in other techniques a device may directly write the pattern, for example, using an electron beam or a laser beam.

As the density of features on the dies and wafers has increased, the minimum dimension (also known as the critical dimension) in the designs has decreased. Unfortunately, due to the wave nature of light, as the dimensions approach length scales comparable to the wavelength of the light used in the photolithography process, the resulting wafer patterns deviate from the corresponding photo-mask patterns and are accompanied by unwanted distortions and artifacts.

Existing techniques, such as Optical Proximity Correction (OPC), attempt to improve resolution and/or a process window in a photolithography process by appropriately pre-distorting the photo-mask pattern such that the wafer pattern is printed more accurately. Moreover, other techniques known as resolution enhancement technologies (RET) also modify the design of the photo-mask in order to improve photolithography. However, determining the necessary photo-mask modifications used in these techniques, which is often determined by trial and error, is increasingly time consuming and expensive.

As a consequence, researchers have begun to investigate alternative techniques for determining improved photo-mask patterns or direct-write patterns for use in lithographic process and/or semiconductor manufacturing. For example, one promising technique, known as Inverse Lithography (ILT), determines a suitable photo-mask pattern or write pattern based on a desired wafer pattern and a model of the semiconductor-manufacturing process. Note that these models may include the details of an optical path in a lithographic tool and/or a model of a resist-development process.

Given the size and complexity of integrated-circuit designs, many ILT or OPC techniques calculate and/or verify the photo-mask or write pattern iteratively. In order to streamline this process and to keep the associated resource utilization bounded, it is important that these calculations be performed efficiently. Unfortunately, existing models of the resist-development process are often complicated. Furthermore, solutions to these models are often determined iteratively. When these calculations are repeated multiple times, such as in an iterative ILT or OPC calculation, there may be a prohibitive increase in the overall calculation time.

Hence what is needed is a method and an apparatus that facilitates modeling of the resist-development process without the above-described problems.

SUMMARY OF THE INVENTION

One embodiment of the present invention provides a method for determining a surface in a material. During this method, arrival times of a wavefront at a first depth in the material are calculated using an Eikonal equation. Note that the first depth is proximate to an outer surface of the material. Next, arrival times of the wavefront at a second depth in the material are calculated using the Eikonal equation and the calculated arrival times at the first depth. Then, the surface in the material is determined based on the calculated arrival times at the first depth, the calculated arrival times at the second depth, and a given time interval. Note that arrival times at a given depth in the material, which includes the first depth or the second depth, are calculated by directly determining a steady-state solution of the Eikonal equation.

In some embodiments, the arrival times at the first depth are calculated based on an initial condition on the outer surface.

In some embodiments, the determined surface in the material is stored in a computer-readable medium.

In some embodiments, calculations at the first depth and the second depth are performed once. Moreover, in some embodiments calculations at the first depth and the second depth are performed sequentially as opposed to iteratively.

In some embodiments, arrival times of the wavefront at a group of depths in the material are calculated. Note that these calculations may be sequentially performed at depths in the group of depths further away from the outer surface than depths in preceding calculations. Furthermore, the calculation at a given depth in the group of depths may be based on the Eikonal equation and the calculated arrival times at an immediately preceding depth in the group of depths. Then, the surface in the material may be determined based on the calculated arrival times at the group of depths and the given time interval.

In some embodiments, the surface is 3-dimensional. Furthermore, in some embodiments the surface corresponds to a resist profile in a lithographic process. Note that the material may correspond to a film to be deposited during a semiconductor-manufacturing process.

In some embodiments, the material at a given depth, which is the first depth and/or the second depth, is divided into a set of cells. Note that the arrival times may be calculated in each cell in the set of cells.

In some embodiments, the Eikonal equation includes:

$$|\mathrm{grad}(T)| \cdot r = 1,$$

where grad( ) is a vector gradient operator, T is a function corresponding to the surface, and r is a vector development rate. Note that r may be determined from a Mack model, a notch model, a lumped-parameter model, an enhanced-Mack model, and/or an enhanced-notch model. Furthermore, T may include a level-set function. For example, T may include a grayscale or a bitmap representation of the surface.

In some embodiments, the determination of the surface is included when determining a process window for a lithographic process and/or a semiconductor-manufacturing process.

In some embodiments, the calculation at a given depth, which is the first depth and/or the second depth, includes sweeping over a first set of values along a first direction in a plane associated with the given depth, and sweeping over a second set of values along a second direction in the plane. For example, the sweeping over a given set of values, which is the first set of values and/or the second set of values, includes sweeping from low-to-high values and/or sweeping from high-to-low values.

In some embodiments, the calculation at a given depth, which is the first depth and/or the second depth, progress out from a starting location in a plane associated with the given depth.

In some embodiments, the Eikonal equation includes a form of a Hamilton-Jacobi equation.

Another embodiment provides a computer system configured to execute instructions corresponding to at least some of the above-described operations.

Another embodiment provides a computer-program product for use in conjunction with the computer system.

Another embodiment provides a mask pattern that is determined in a process that includes the method for determining the surface. This mask pattern may be used to produce a photo-mask, which may be used to produce a semiconductor wafer in a photo-lithography process. However, in some embodiments the mask pattern may be used to produce a semiconductor wafer in a maskless lithography process, such as a lithographic process that uses a direct write device.

BRIEF DESCRIPTION OF THE DRAWINGS

Note that like reference numerals refer to corresponding parts throughout the drawings.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These systems and processes may be used to model at least a portion of a (photo-) lithographic processes and/or semiconductor-manufacturing processes. These processes may include photo-masks that print patterns onto wafers and/or semiconductor dies, and/or devices that directly write patterns onto the wafers and/or semiconductor dies (such as laser writers or e-beam writers).

In particular, a surface in a material, such as a resist profile, may be determined using a fast-sweeping calculation. In this calculation, arrival times of a wavefront at a first layer in the material may be determined using an Eikonal equation. For example, the first layer may be divided into cells and the arrival times in each cell may be determined by sweeping over a set of values, such as low-to-high values and/or from high-to-low values. Note that in some embodiments the arrival times may be determined based on an initial condition on an outer surface of the material. Next, arrival times at one or more additional layers in the material further away from the outer surface may be sequentially determined using the Eikonal equation. Furthermore, the arrival times in a given layer in the one or more additional layers may also be determined using the calculated arrival times for an immediately preceding layer in the material.

Then, the resist profile may be determined from the set of calculated arrival times and a given time interval since the start of the resist-development process. For example, the resist profile may be determined by interpolating between the calculated arrival times at the different layers in the material. In this way, the resist profile may be determined without performing an iterative calculation, thereby improving the overall calculation efficiency.

In some embodiments, the Eikonal equation includes a form of a Hamilton-Jacobi equation, such as:

$$|\mathrm{grad}(T)|\cdot r=1,$$

where grad( ) is a vector gradient operator, T is a function corresponding to the surface, and r is a vector development rate. Note that r may be determined from a Mack model, a notch model, a lumped-parameter model, an enhanced-Mack model, and/or an enhanced-notch model. Furthermore, T may include a level-set function. For example, T may include a grayscale or a bitmap representation of the surface.

In the discussion that follows, fast sweeping should be understood to include a direct solving numerical technique for determining steady-state solutions to equations, such as the Eikonal equation. In particular, rather than determining a 3-dimensional (3D) solution (such as that associated with a wavefront), arrival time solutions on a sequence of 2-dimensional (2D) surfaces may be determined by sweeping from low values to high values and back along orthogonal directions in each of the 2D surfaces. For a given surface, the set of values in each direction may correspond to a full set of values in the 2D surface. Thus, the fast sweeping technique may be non-evolutionary or non-iterative. Note that this technique may reduce or eliminate memory constraints, such as those associated with DRAM memory, when solving equations.

However, in some embodiments a fast marching technique may be used. Note that in the discussion that follows, fast marching should be understood to include an iterative numerical technique in which a narrower set of values are used. Thus, the time evolution of a wavefront may be determined. Note that this technique may be appropriate if a wavefront does not propagate over a wide area. Furthermore, fast marching may allow solutions to be quickly determined.

Embodiments of a computer system, a method, and software for determining a surface in a material will now be described. In particular, a resist profile defined in the material during a lithographic process and/or a semiconductor-manufacturing process may be determined using a model of this process. During this process, a resist layer may be deposited on a surface. This layer may be exposed and subjected to post-exposure baking. Then, a solvent may be used to develop soluble regions, leaving the non-soluble regions. The boundary or interface between these regions, which is referred to as a resist profile, will evolve as a function of time during the development process. As described below, a fast-sweeping technique may be used to solve the differential equation that describes the interface in models of the lithographic process and/or the semiconductor-manufacturing process.

Figure 1:
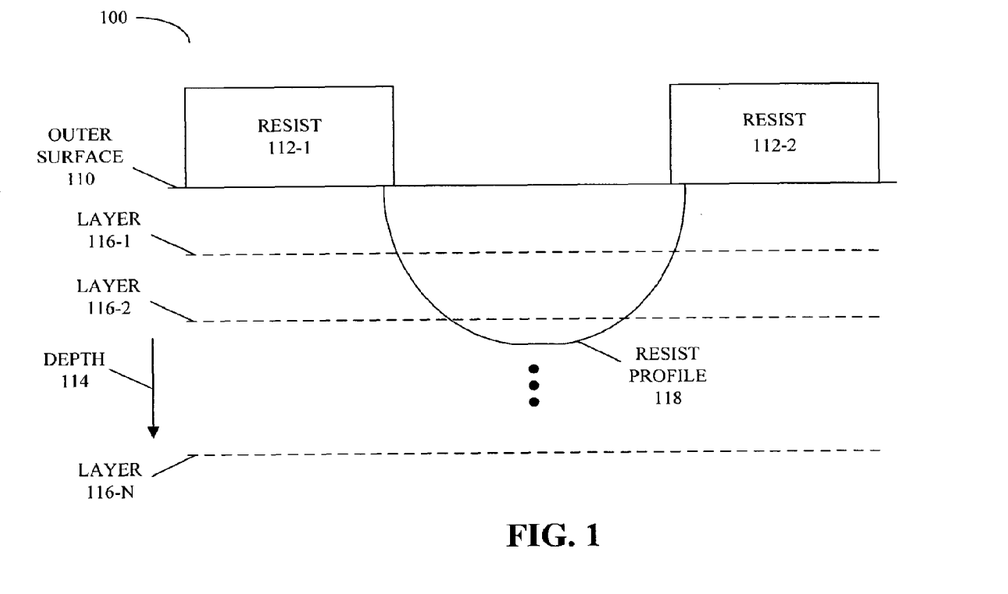
FIG. 1 is a block diagram illustrating a resist-development calculation in accordance with an embodiment of the present invention.

FIG. 1 presents a block diagram illustrating a resist-development calculation in accordance with an embodiment of the present invention. During this process, a material 100 (for example, one corresponding to a semiconductor die or wafer, or to a film to be deposited during a semiconductor-manufacturing process) is sub-divided into layers 116 through a depth 114 of the material 100. Note that these layers 116 may have a fixed spacing or a variable spacing from one another. Furthermore, an initial condition on an outer surface 110, such as the placement of resist 112, may be defined or specified.

Then, a surface, such as a resist profile 118, in the lithographic process and/or the semiconductor-manufacturing process, may be calculated. In some embodiments, the resist profile 118 is determined based on arrival times of a wavefront in the layers 116.

Figure 2:
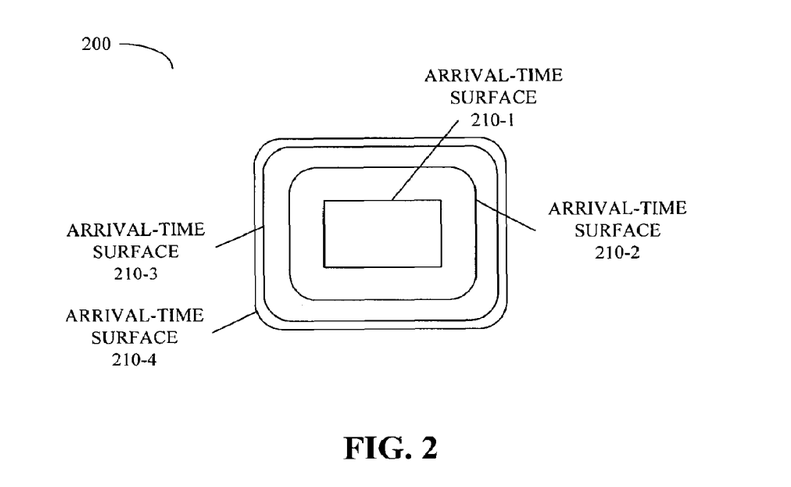
FIG. 2 is a block diagram illustrating a resist-development calculation in accordance with an embodiment of the present invention.

As described further below, the wavefront may be a solution to a differential equation that describes a resist-development process, and arrival times of the wavefront in each of the layers 116 may be calculated. Note that a given arrival time corresponds to 2-dimensional (2D) surfaces of constant arrival time. This is shown in FIG. 2, which presents a block diagram illustrating calculated arrival-time surfaces 210 in a given layer during a resist-development calculation 200 in accordance with an embodiment of the present invention. Referring back to FIG. 1, the calculation may proceed sequentially through the layers 116, such that the arrival-time surfaces in a first layer 116-1 may be determined, at least in part, based on the initial condition on the outer surface 110.

Then, the arrival-time surfaces in a second layer 116-2 may be determined, at least in part, based on the arrival-time surfaces in the first layer 116-1. This process may be sequentially repeated for the layers 116 further from the outer surface 110 until the arrival-time surfaces are determined for all of the layers 116.

Next, the resist profile 118 may be determined from the calculated arrival-time surfaces in the layers 116 for a given time interval since the start of the resist-development process. For example, the resist profile 118 at the given time interval may be determined by interpolating between 3-dimensional (3D) surfaces through the material 100 that correspond to two different arrival times. Alternatively, the interpolation may be between 2D arrival-time surfaces, such as the arrival-time surfaces 210 (FIG. 2), in each of the layers 116, and then the 3D resist profile 118 may be determined from these interpolated surfaces.

In some embodiments, the arrival-time surfaces 210 (FIG. 2) in each of the layers 116 are determined once during the calculation. Furthermore, as noted above, in some embodiments the arrival-time surfaces 210 (FIG. 2) in each of the layers 116 are determined sequentially as opposed to iteratively.

In some embodiments, each of the layers 116 is divided into a set of cells and arrival times of the wavefront may be calculated in each of these cells. Then, 2D and/or 3D arrival-times surfaces may be determined from the arrival times in these cells. In an exemplary embodiment, the material 100 has a thickness of 200 nm, there are 4 layers 116, which are separated from one another by 50 nm, and each layer is divided into a 2D grid of cells. Note that each of these cells has an area of 8×8 nm$^2$.

In some embodiments, the arrival times of the wavefront is further determined using an Eikonal equation, which is used to model the resist-development process. In particular, the Eikonal equation may be $$|\mathrm{grad}(T)| \cdot r = 1,$$

where grad( ) is a vector gradient operator, T is a function corresponding to the surface (such as the resist profile), and r is a vector development rate. Note that r may be determined from a Mack model, a notch model, a lumped-parameter model, an enhanced-Mack model, and/or an enhanced-notch model. Furthermore, T may include a level-set function. For example, T may include a grayscale or a bitmap representation of the surface. In some embodiments, the Eikonal equation includes a form of a Hamilton-Jacobi equation.

In some embodiments, the Eikonal equation may be solved in a given layer (i.e., the arrival times in cells in the layer may be determined) using a Green's function, a difference equation, and/or other techniques as known in the art. Furthermore, the Eikonal equation may be solved in the given layer using a fast-sweeping process. For example, the calculation may progress out from a starting location in a plane associated with the given layer or depth in the material. This calculation may include sweeping over a first set of values along a first direction in the plane, and sweeping over a second set of values along a second direction in the plane. Note that these directions may be orthogonal. For example, the sweeping (i.e., systematically and sequentially varying) over a given set of values may include sweeping from low-to-high values (such as from −10 to +10) and then sweeping from high-to-low values (or vice versa) in a given direction in the given layer.

By determining the resist profile in a sequential fashion it may be possible to avoid an iterative solution to the Eikonal equation. As a consequence, such a physical-resist model may be used in other iterative calculations, such as the ILT calculations. This may allow faster computations of mask-patterns and/or direct-write patterns. In addition, multiple simulations may be performed in order to determine a process window for the lithographic process and/or the semiconductor-manufacturing process.

Note that in some embodiments, the embodiments illustrated in FIGS. 1 and 2 may include fewer or additional components, two or more components may be combined into a single component, and/or a position of one or more components may be changed.

Figure 3:
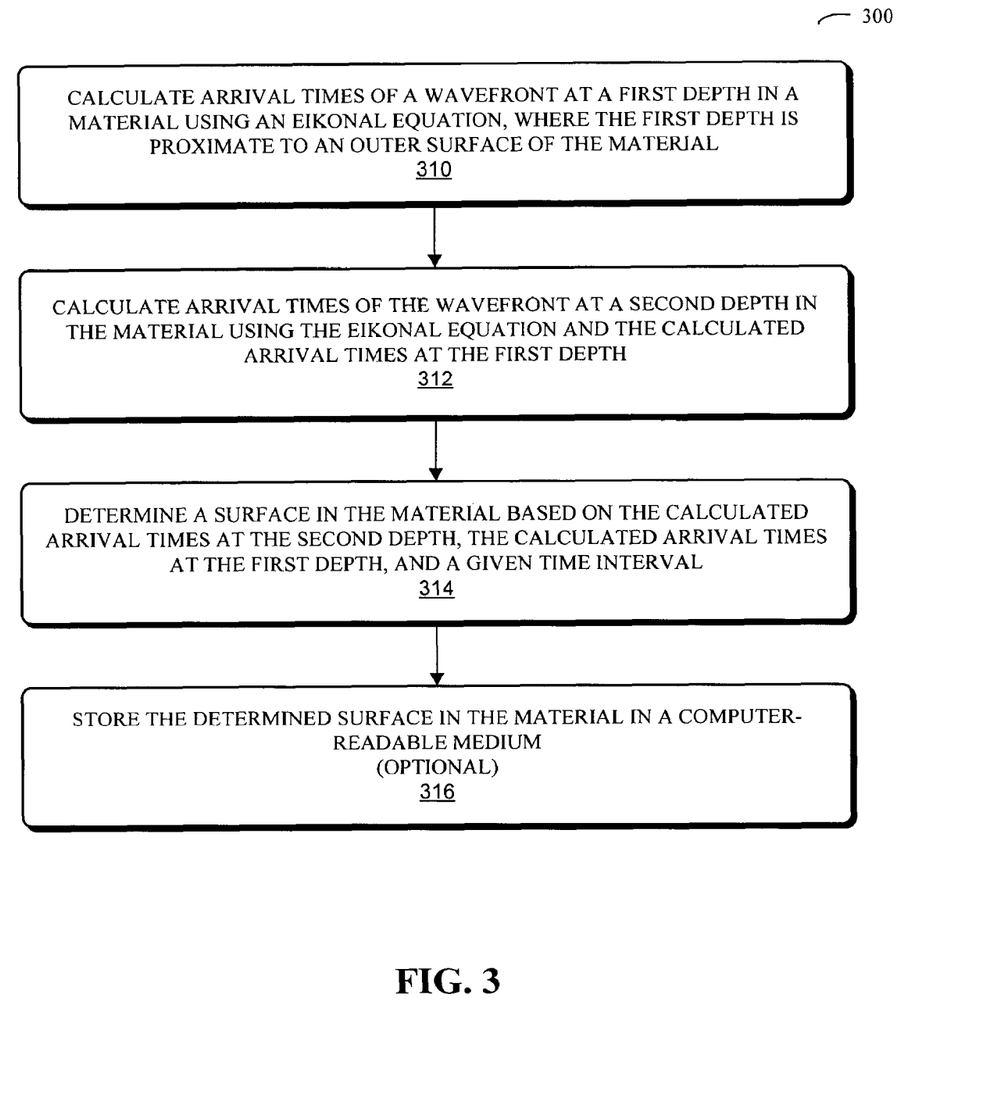
FIG. 3 is a flow chart illustrating a process for determining a surface in a material in accordance with an embodiment of the present invention.

Methods for determining a surface in a material during the lithographic process and/or the semiconductor-manufacturing process will now be described. FIG. 3 presents a flow chart illustrating a process 300 for determining a surface in a material in accordance with an embodiment of the present invention. During this process, arrival times of a wavefront at a first depth in a material are calculated using an Eikonal equation (310). Note that the first depth is proximate to an outer surface of the material. Then, arrival times of the wavefront at a second depth in the material are calculated using an Eikonal equation and the calculated arrival times at the first depth (312). Next, a surface in the material is determined based on the calculated arrival times at the second depth, the calculated arrival times at the first depth, and a given time interval (314). In some embodiments, the determined surface in the material is optionally stored in a computer-readable medium (316).

Note that in some embodiments of the process 300 there may be additional or fewer operations, the order of the operations may be changed, and two or more operations may be combined into a single operation. For example, one or more operations similar to the operation 312 may be sequentially repeated for additional layers in the material.

An exemplary embodiment of the process for determining a resist profile in a material will now be described. In this example, arrival times in multiple layers and the overall resist profile were determined. These calculations used parameters including a maximal development rate $R_{MAX}$ of 190 nm/s in a fully exposed region in the material, a minimal development rate $R_{MIN}$ of 0.08 nm/s at a large non-exposed region in the material, and a non linearity of 5 for the developer. Note that in a lumped-parameter model, this nonlinearity is referred to as gamma, and in a Mack model or a notch model this nonlinearity is referred to as the parameter n. Furthermore, the threshold position of the inhibitor in the simulations was 0.8 and the characteristic depth of the inhibitor ($D_{INHIBITOR}$) was 200 nm.

The so-called Dill B parameter, which characterizes the absorbance as light propagates from the top of resist toward the bottom of the resist, was 1.492 $\mu m^{-1}$. In addition, the height measured from the bottom of the resist layer, where the critical-dimension scanning electron microscope (CD-SEM) measurement was determined, as a percentage of the resist-layer height was 10 nm. Furthermore, the relative surface development rate ($R_{RELATIVE}$) relative to the bulk development (due to surface inhibition) was 0.1. Finally, note that the final development rate r(z) at a depth z in the material was defined by $$r(z) = r_0 \left(1 - (1 - R_{RELATIVE}) \cdot \exp\left(\frac{-z}{D_{INHIBITOR}}\right)\right),$$

where $r_0$ is the development rate in the bulk region (which is defined by $R_{MAX}$ and $R_{MIN}$).

Figure 4:
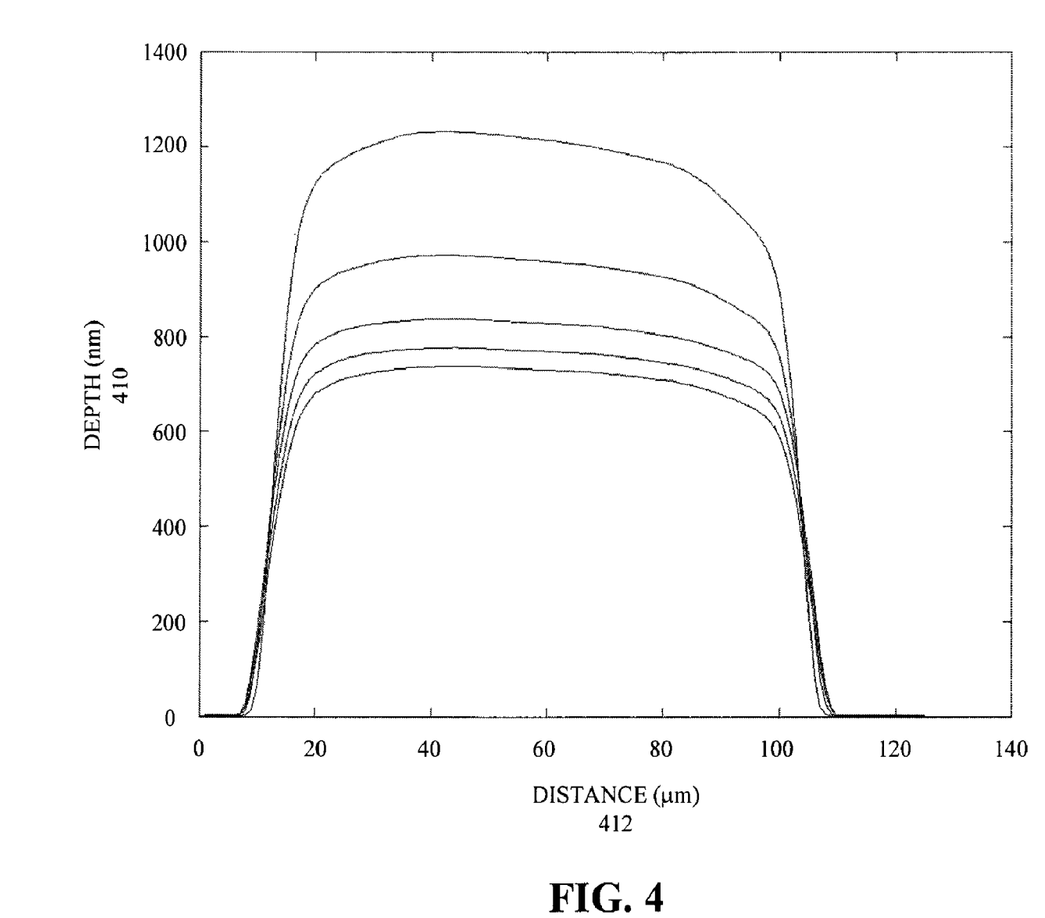
FIG. 4 is a block diagram illustrating arrival times in a material during a resist-development process in accordance with an embodiment of the present invention.

FIG. 4 presents a block diagram illustrating the calculated arrival times as a function of depth (nm) 410 in a material and horizontal distance (μm) 412 across an outer surface of the material during a resist-development process in accordance with this exemplary embodiment of the present invention.

Figure 5:
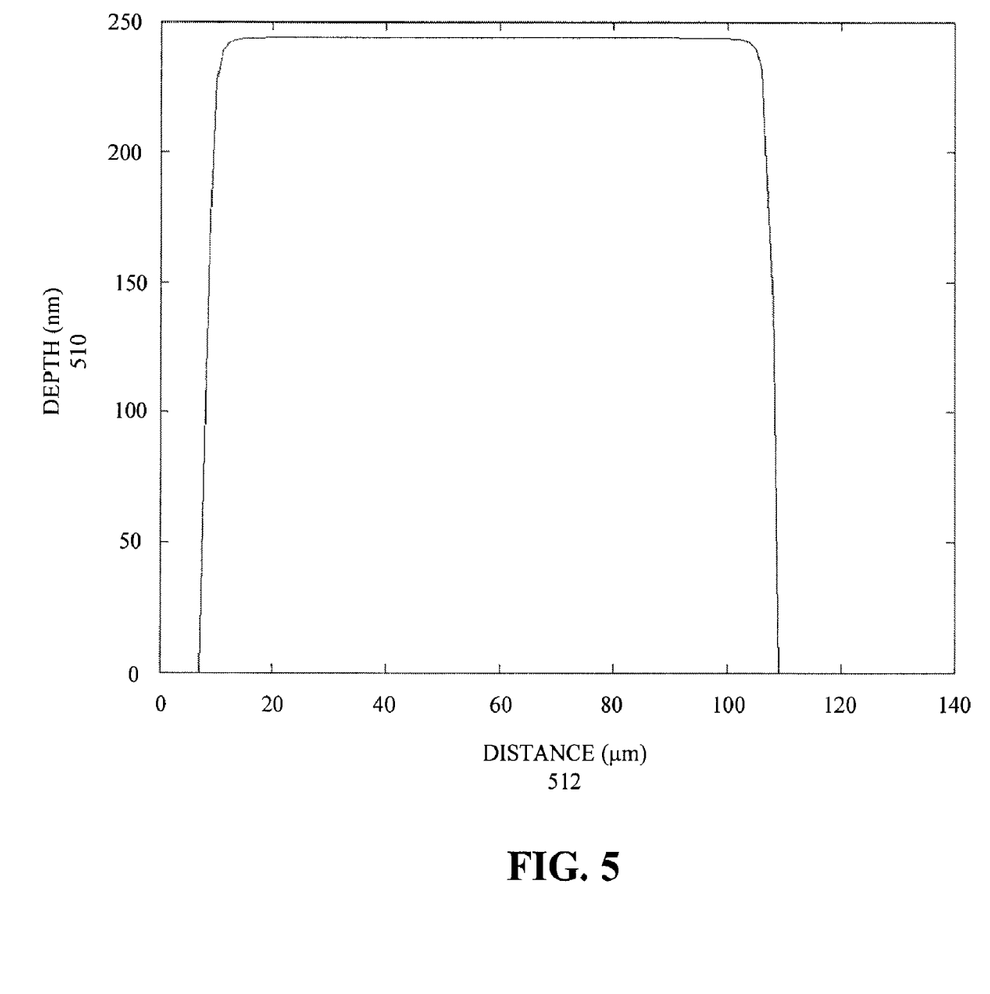
FIG. 5 is a block diagram illustrating a resist profile in a material in accordance with an embodiment of the present invention.

FIG. 5 presents a block diagram illustrating the calculated resist profile as a function of depth (nm) 510 in the material and horizontal distance (μm) 512 across the outer surface of the material during the resist-development process in accordance with this exemplary embodiment of the present invention. The resist profile was determined using the arrival times in FIG. 4 for a time interval of 20 seconds since the start of the resist-development process.

Figure 6:
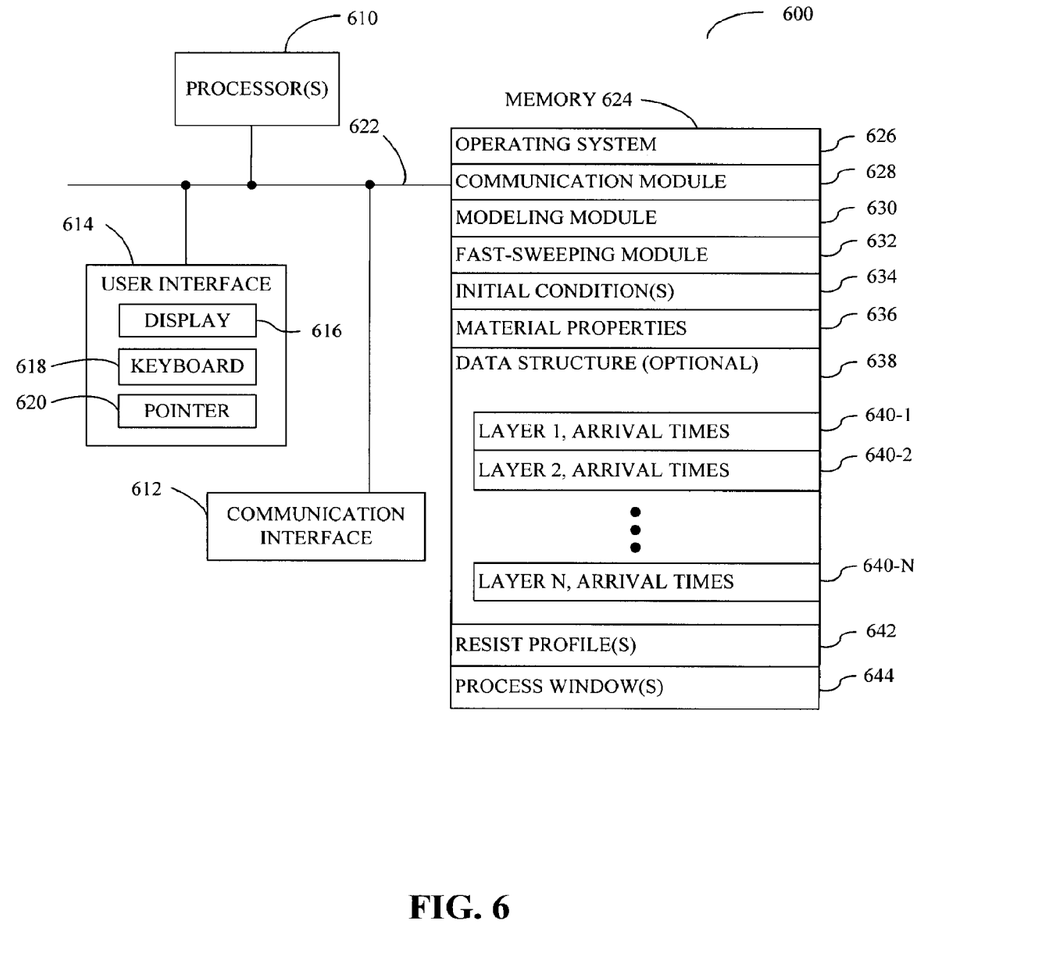
FIG. 6 is a block diagram illustrating a computer system in accordance with an embodiment of the present invention.

Embodiments of computer systems that may implement the embodiments described previously will now be described. FIG. 6 presents a block diagram illustrating a computer system 600 in accordance with an embodiment of the present invention. The computer system 600 includes one or more processors 610, a communication interface 612, a user interface 614, and one or more signal lines 622 coupling these components together. Note that the one or more processing units 610 may support parallel processing and/or multi-threaded operation, the communication interface 612 may have a persistent communication connection, and the one or more signal lines 622 may constitute a communication bus. Moreover, the user interface 614 may include a display 616, a keyboard 618, and/or a pointer 620, such as a mouse.

Memory 624 in the computer system 600 may include volatile memory and/or non-volatile memory. More specifically, memory 624 may include ROM, RAM, EPROM, EEPROM, FLASH, one or more smart cards, one or more magnetic disc storage devices, and/or one or more optical storage devices. Memory 624 may store an operating system 626 that includes procedures (or a set of instructions) for handling various basic system services for performing hardware dependent tasks. The memory 624 may also store communications procedures (or a set of instructions) in a communication module 628. The communication procedures may be used for communicating with one or more computers, devices and/or servers, including computers, devices and/or servers that are remotely located with respect to the computer system 600.

Memory 624 may also include one or more program modules (or a set of instructions), including a modeling module 630 (or a set of instructions) for modeling a lithographic process and/or a semiconductor-manufacturing process, and a fast-sweeping module 632 (or a set of instructions) for determining the surface (such as the resist profile) in the material during the lithographic process and/or the semiconductor-manufacturing process. In addition, memory 624 may include initial conditions 634 and/or material properties 636 for use by the modeling module 630 and/or the fast-sweeping module 632.

In some embodiments, the memory 624 includes an optional data structure 638. This data structure may store arrival times 640 for some or all of the layers in the material. Furthermore, in some embodiments the memory 624 includes determined resist profiles 642 and/or calculated process windows 644 for the lithographic process and/or the semiconductor-manufacturing process.

Instructions in the various modules in the memory 624 may be implemented in a high-level procedural language, an object-oriented programming language, and/or in an assembly or machine language. The programming language may be compiled or interpreted, i.e., configurable or configured to be executed by the one or more processing units 610.

Although the computer system 600 is illustrated as having a number of discrete components, FIG. 6 is intended to be a functional description of the various features that may be present in the computer system 600 rather than as a structural schematic of the embodiments described herein. In practice, and as recognized by those of ordinary skill in the art, the functions of the computer system 600 may be distributed over a large number of servers or computers, with various groups of the servers or computers performing particular subsets of the functions. In some embodiments, some or all of the functionality of the computer system 600 may be implemented in one or more ASICs and/or one or more digital signal processors DSPs.

Computer system 600 may include fewer components or additional components, two or more components may be combined into a single component, and/or a position of one or more components may be changed. In some embodiments the functionality of computer system 600 may be implemented more in hardware and less in software, or less in hardware and more in software, as is known in the art.

Figure 7:
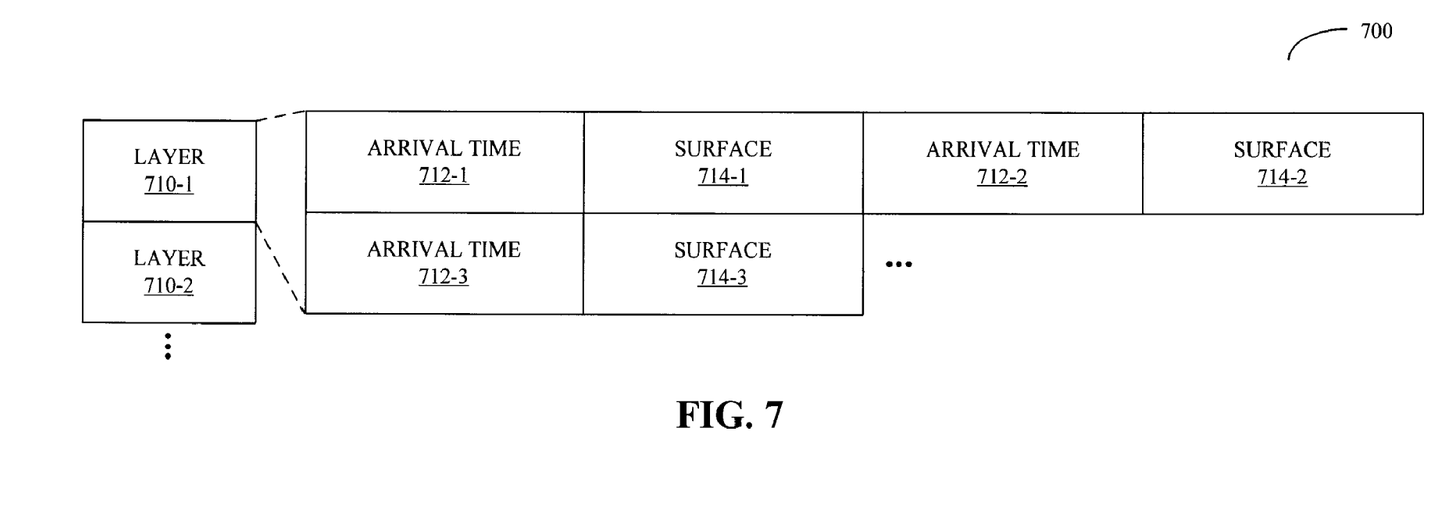
FIG. 7 is a block diagram illustrating a data structure in accordance with an embodiment of the present invention.

Data structures that may be used in the computer system 600 (FIG. 6) will now be described. FIG. 7 presents a block diagram illustrating a data structure 700 in accordance with an embodiment of the present invention. This data structure may include arrival-time results for layers 710. The results for each of the layers 710, such as layer 710-1, may include arrival times 712 and corresponding surfaces 714 (such as a set of cells in the layer 710-1 that each have a common arrival time). Note that in some embodiments of the data structure 700 there may be fewer or additional components, two or more components may be combined into a single component, and/or a position of one or more components may be changed.

While the preceding discussion has focused on solutions to a resist-development process, such as that described by an Eikonal equation, in other embodiments the method and/or apparatus may be used to solve other differential equations in applied mathematical problems.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a surface associated with a resist profile in a material, comprising:
   calculating, using a computer, arrival times of a wavefront in a resist-development process at a first depth in the material in accordance with an Eikonal equation, wherein the first depth is proximate to an outer surface of the material, and wherein a vector development rate in the Eikonal equation corresponds to a physical property of the material;
   calculating arrival times of the wavefront at a second depth in the material, which relative to the first depth is distal from the outer surface, in accordance with the Eikonal equation and the calculated arrival times at the first depth;
   determining, using a fast-sweeping calculation, the surface associated with the resist profile in the material based on the calculated arrival times at the first depth, the calculated arrival times at the second depth, and a given time interval, wherein arrival times at a given depth in the material, which includes the first depth or the second depth, are calculated by directly determining a steady-state solution of the Eikonal equation;
   wherein the calculation at the given depth, which is either or both of the first depth and the second depth, includes sweeping over the first set of values along a first direction in a plane associated with the given depth, and sweeping over a second set of values along a second direction in the plane; and
   wherein the sweeping over a given set of values, which is either or both of the first set of values and the second set of values, includes sweeping from low-to-high values and sweeping from high-to-low values.

2. The method of claim 1, wherein the arrival times at the first depth are calculated in accordance with an initial condition on the outer surface.

3. The method of claim 1, further comprising storing the determined surface in the material in a computer-readable medium.

4. The method of claim 1, further comprising:
   calculating arrival times of the wavefront at a group of depths in the material, wherein the calculations are sequentially performed at depths in the group of depths further away from the outer surface than depths in preceding calculations, and wherein the calculation at a given depth in the group of depths is in accordance with the Eikonal equation and the calculated arrival times at an immediately preceding depth in the group of depths; and
   determining the surface in the material based on the calculated arrival times at the group of depths and the given time interval.

5. The method of claim 1, wherein calculations at the first depth and the second depth are performed once.

6. The method of claim 1, wherein calculations at the first depth and the second depth are performed sequentially as opposed to iteratively.

7. The method of claim 1, wherein the surface is 3-dimensional.

8. The method of claim 1, wherein the material at a given depth, which is either or both of the first depth and the second depth, is divided into a set of cells, and wherein the arrival times are calculated in each cell in the set of cells.

9. The method of claim 1, wherein the surface corresponds to a resist profile in a lithographic process.

10. The method of claim 1, wherein the material corresponds to a film to be deposited during a semiconductor-manufacturing process.

11. The method of claim 1, wherein the Eikonal equation includes:

$$|\text{grad}(T)| \cdot r = 1,$$

where grad( ) is a vector gradient operator, T is a function corresponding to the surface, and r is a vector development rate.

12. The method of claim 11, wherein r is determined from a Mack model, a notch model, a lumped-parameter model, an enhanced-Mack model, or an enhanced-notch model.

13. The method of claim 11, wherein T includes a level-set function.

14. The method of claim 11, wherein T includes a grayscale or a bitmap representation of the surface.

15. The method of claim 1, wherein the determination of the surface is included when determining a process window for a lithographic process.

16. The method of claim 1, wherein the determination of the surface is included when determining a process window for a semiconductor-manufacturing process.

17. The method of claim 1, wherein the calculation at a given depth, which is either or both of the first depth and the second depth, progress out from a starting location in a plane associated with the given depth.

18. The method of claim 1, wherein the Eikonal equation includes a form of a Hamilton-Jacobi equation.

19. The method of claim 1, wherein the steady-state solution is determined using fast sweeping.

20. A computer-program product for use in conjunction with a computer system, the computer-program product comprising a computer-readable storage medium and computer-program instructions stored therein for determining a surface associated with a resist profile in a material, the computer-program product including:
   instructions for calculating arrival times of a wavefront in a resist-development process at a first depth in the material in accordance with an Eikonal equation, wherein the first depth is proximate to an outer surface of the material, and wherein a vector development rate in the Eikonal equation corresponds to a physical property of the material;
   instructions for calculating arrival times of the wavefront at a second depth in the material, which relative to the first depth is distal from the outer surface, in accordance with the Eikonal equation and the calculated arrival times at the first depth;
   instructions for determining, using fast-sweeping calculation, the surface associated with the resist profile in the material based on the calculated arrival times at the first depth, the calculated arrival times at the second depth, and a given time interval, wherein arrival times at a given depth in the material, which includes the first depth or the second depth, are calculated by directly determining a steady-state solution of the Eikonal equation;

wherein the instructions for calculation at the given depth, which is either or both of the first depth and the second depth, includes instructions for sweeping over the first set of values along a first direction in a plane associated with the given depth, and sweeping over a second set of values along a second direction in the plane; and wherein the instructions for sweeping over a given set of values, which is either or both of the first set of values and the second set of values, includes instructions for sweeping from low-to-high values and sweeping from high-to-low values.

21. A computer system, comprising:

at least one processor;

at least one memory; and at least one program module, the program module stored in the memory and configured to be executed by the processor, wherein at least the program module is for determining a surface associated with a resist profile in a material, at least the program module including:

instructions for calculating arrival times of a wavefront in a resist-development process at a first depth in the material in accordance with an Eikonal equation, wherein the first depth is proximate to an outer surface of the material, and wherein a vector development rate in the Eikonal equation corresponds to a physical property of the material;

instructions for calculating arrival times of the wavefront at a second depth in the material, which relative to the first depth is distal from the outer surface, in accordance with the Eikonal equation and the calculated arrival times at the first depth;

instructions for determining, using fast-sweeping calculation, the surface associated with the resist profile in the material based on the calculated arrival times at the first depth, the calculated arrival times at the second depth, and a given time interval, wherein arrival times at a given depth in the material, which includes the first depth or the second depth, are calculated by directly determining a steady-state solution of the Eikonal equation;

wherein the instructions for calculation at the given depth, which is either or both of the first depth and the second depth, includes instructions for sweeping over the first set of values along a first direction in a plane associated with the given depth, and sweeping over a second set of values along a second direction in the plane; and wherein the instructions for sweeping over a given set of values, which is either or both of the first set of values and the second set of values, includes instructions for sweeping from low-to-high values and sweeping from high-to-low values.

22. A computer system, comprising:

means for computing;

means for storing; and at least one program module mechanism, the program module mechanism stored in at least the means for storing and configured to be executed by at least the means for computing, wherein at least the program module mechanism is for determining a surface associated with a resist profile in a material, at least the program module mechanism including:

instructions for calculating arrival times of a wavefront in a resist-development process at a first depth in the material in accordance with an Eikonal equation, wherein the first depth is proximate to an outer surface of the material, and wherein a vector development rate in the Eikonal equation corresponds to a physical property of the material;

instructions for calculating arrival times of the wavefront at a second depth in the material, which relative to the first depth is distal from the outer surface, in accordance with the Eikonal equation and the calculated arrival times at the first depth;

instructions for determining, using fast-sweeping calculation, the surface associated with the resist profile in the material based on the calculated arrival times at the first depth, the calculated arrival times at the second depth, and a given time interval, wherein arrival times at a given depth in the material, which includes the first depth or the second depth, are calculated by directly determining a steady-state solution of the Eikonal equation;

wherein the instructions for calculation at the given depth, which is either or both of the first depth and the second depth, includes instructions for sweeping over the first set of values along a first direction in a plane associated with the given depth, and sweeping over a second set of values along a second direction in the plane; and wherein the instructions for sweeping over a given set of values, which is either or both of the first set of values and the second set of values, includes instructions for sweeping from low-to-high values and sweeping from high-to-low values.

* * * * *